United States Patent [19]
Inoue

[11] Patent Number: 5,939,780
[45] Date of Patent: Aug. 17, 1999

[54] POWER SUPPLY CIRCUIT FOR A SEMICONDUCTOR INTEGRATED CIRCUIT

[75] Inventor: Tomoo Inoue, Tokyo, Japan

[73] Assignee: NEC Corporation, Tokyo, Japan

[21] Appl. No.: 08/907,923

[22] Filed: Aug. 11, 1997

[30] Foreign Application Priority Data

Aug. 12, 1996 [JP] Japan ..................................... 8-212495

[51] Int. Cl.[6] .............................. H01L 23/48; H01L 23/52
[52] U.S. Cl. ........................... 257/692; 257/690; 257/691
[58] Field of Search ..................................... 257/692, 666, 257/693, 690, 691

[56] References Cited

U.S. PATENT DOCUMENTS 5,264,727  11/1993  Kudou et al. ............................ 257/773
5,386,127   1/1995  Furuyama ............................... 257/786

FOREIGN PATENT DOCUMENTS 6-163700  6/1994  Japan .

*Primary Examiner*—Mahshid Saadat
*Assistant Examiner*—Jhihan B. Clark
*Attorney, Agent, or Firm*—Sughrue, Mion, Zinn, Macpeak & Seas, PLLC

[57] ABSTRACT

A power supply circuit of a semiconductor integrated circuit consuming a large load current at a low voltage has a source potential controller and a ground potential controller for stabilizing a supply voltage to the integrated circuit. The source potential controller controls the potential of the source line in the integrated circuit based on a reference source potential and a sensed potential of the source line. The ground potential controller controls the potential of the ground line in the integrated circuit based on a reference ground potential and a sensed potential of the ground line. Both the source potential controller and ground potential controller may be disposed outside or inside the integrated circuit.

15 Claims, 5 Drawing Sheets

POWER SUPPLY CIRCUIT FOR A SEMICONDUCTOR INTEGRATED CIRCUIT

BACKGROUND OF THE INVENTION (A) Field of the Invention

The present invention relates to a power supply circuit for a semiconductor integrated circuit and, more specifically, to a power supply circuit having a voltage controller for controlling the supply voltage inside the integrated circuit.

(B) Description of the Related Art

A constant voltage of the power source is generally requested in an integrated circuit consuming a large load current at a low supply voltage. FIG. 1 shows a conventional arrangement of an integrated circuit and an associated power source. The integrated circuit includes a lead frame 11 having a source terminal 12 and a ground terminal 14 formed on the lead frame 11, across which is connected a voltage source 51 which supplies a voltage required by the integrated circuit. The lead frame 11 includes an island 52 mounting thereon a pellet or chip 16 having a source pad 17 and a ground pad 18, which are connected with the lead terminals 12 and 14, respectively, by bonding wires 21.

The pellet 16 also mounts thereon circuit blocks 36 to 40, which are fed with electric power from a source line 22 and a ground line 23 connected with the pads 17 and 18, respectively. The connection between the source terminal 12 and the source pad 17 through the bonding wire 21 involves a parasitic resistance because of the contact resistance therebetween. The source line 22, which is formed by a metal wire, also involves a parasitic resistance. A parasitic resistance is also involved in the ground terminal 14, ground pad 18, bonding wire 21 and ground line 13.

A power supply to the integrated circuit 11 shown in FIG. 1 is effected by applying a constant voltage from the voltage source 51 across the lead terminals 12 and 14.

A problem arises with the conventional integrated circuit in that a desired supply voltage cannot be secured for the integrated circuit when a large load current flows through the integrated circuit at a low supply voltage. This is because the influence of the parasitic resistance becomes significant as the load current increases, lowering the source potential and raising the ground potential.

An improved integrated circuit is also known which includes an increased number of source pads to reduce the parasitic resistance as involved in the source line and ground line to stabilize the source voltage of the integrated circuit, as described in JP-A-6(1994)-163700, for example.

FIG. 2 shows the improved integrated circuit, which has an internal circuit 107 in the central part of a rectangular substrate, a plurality of source pads P1, P2 and P3 disposed adjacent to respective sides S1, S2 and S3 of the substrate and connected together by an in-package wiring 108 to an external source terminal 106. A functional circuit 104 is disposed adjacent to the top side S1 of the substrate to activate the internal circuit 107. The functional circuit 104 is connected to the source pad P1 by a metallic film wiring L1 formed on the substrate and also connected to the source pad P2 on the left side S2 by a metallic film wiring L2. Another functional circuit 105 is disposed adjacent to the bottom side S4, and connected to the source pad P2 by a metallic film wiring L3 and to the source pad P3 by a metallic film wiring L4. A metallic film wiring L5 provides a connection between the source pads P1 and P3.

It will be noted that each of the wirings L1, L2, L3, L4 and L5 is associated with a corresponding parasitic resistance R1, R2, R3, R4 and R5. The parasitic resistance of the metallic film wiring between the functional circuit 105 and the combination of source pads P2 and P3 connected to the external terminal 106 through the in-package wiring 108 is a parallel resistance formed by parasitic resistances R3 and R4 of the wiring L3 and L4.

Assuming that the source pads P2 and P3 were not provided, the functional circuit 105 is fed with electric power from only the source pad P1, and the resulting parasitic resistance involved in the functional circuit would be a parallel resistance of the series parasitic resistances R1, R2 and R3 and the series resistance of parasitic resistances R4 and R5. Thus it will be seen that the resultant parasitic resistance would be significantly larger compared to that when the source pads P2 and P3 are provided. The provision of an increased number of source pads thus reduces the parasitic resistance involved in the wiring, and hence a voltage drop, thereby stabilizing the supply voltage applied to the integrated circuit.

A problem with the improved integrated circuit resides in the fact that if the integrated circuit requests a large load current at a low supply voltage, there must be provided a large number of source pads, with the consequence that an increased area of the substrate must be allotted to the source pads, resulting in an increased size of the integrated circuit.

SUMMARY OF THE INVENTION

It is an object of the present invention to provide a semiconductor integrated circuit wherein a stabilized power supply is effected to the integrated circuit by compensating a voltage drop caused by parasitic resistances in the integrated circuit, without increasing the number of source pads and ground pads as well as the number of source terminals and ground terminals.

The present invention provides a semiconductor integrated circuit comprising a semiconductor chip or pellet mounted on a lead frame. The pellet includes a source line having a first impedance per unit length, a ground line having a second impedance per unit length, an internal circuit connected to the source line and ground line for receiving electric power therefrom, a source potential sense line connected to a first sense point of the source line and having a third impedance per unit length different from the first impedance per unit length, and a ground potential sense line connected to a second sense point of the ground line and having a fourth impedance per unit length different from the second impedance per unit length.

In accordance with the semiconductor integrated circuit according to the present invention, a constant supply voltage is applied to the internal circuit of the semiconductor integrated circuit, by a source potential controller for controlling the potential of the source line based on the potential sensed by the source potential sense line and a ground potential controller for controlling the potential of the ground line based on the potential sensed by the ground potential sense line, substantially without increasing the number of pads and lead terminals. Each of the source potential controller and ground potential controller can be implemented by a combination of a transistor and an amplifier, which only moderately increases the size of the semiconductor integrated circuit.

The above and other objects, features and advantages of the present invention will be more apparent from the following description, referring to the accompanying drawings.

DESCRIPTION OF THE PREFERRED EMBODIMENTS

Figure 1:
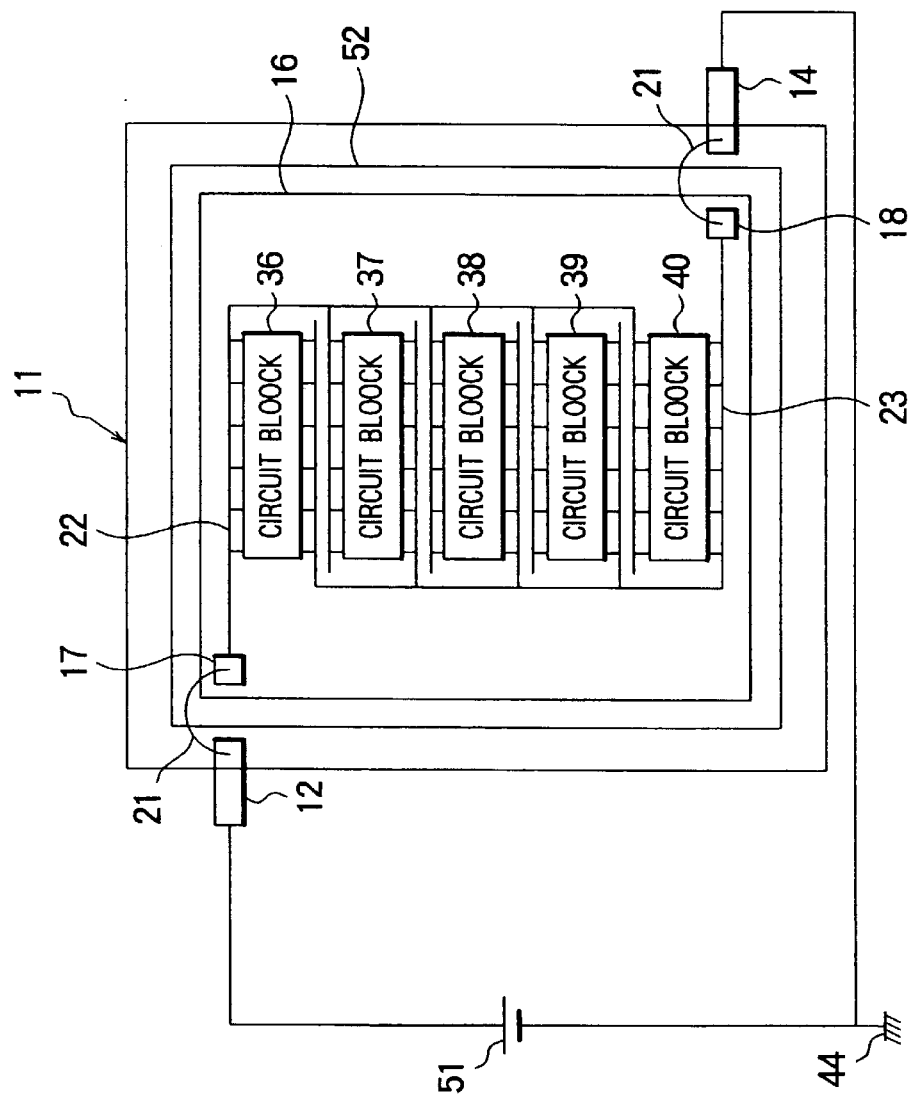
FIG. 1 is a block diagram of a conventional semiconductor integrated circuit including a power supply circuit.
Figure 2:
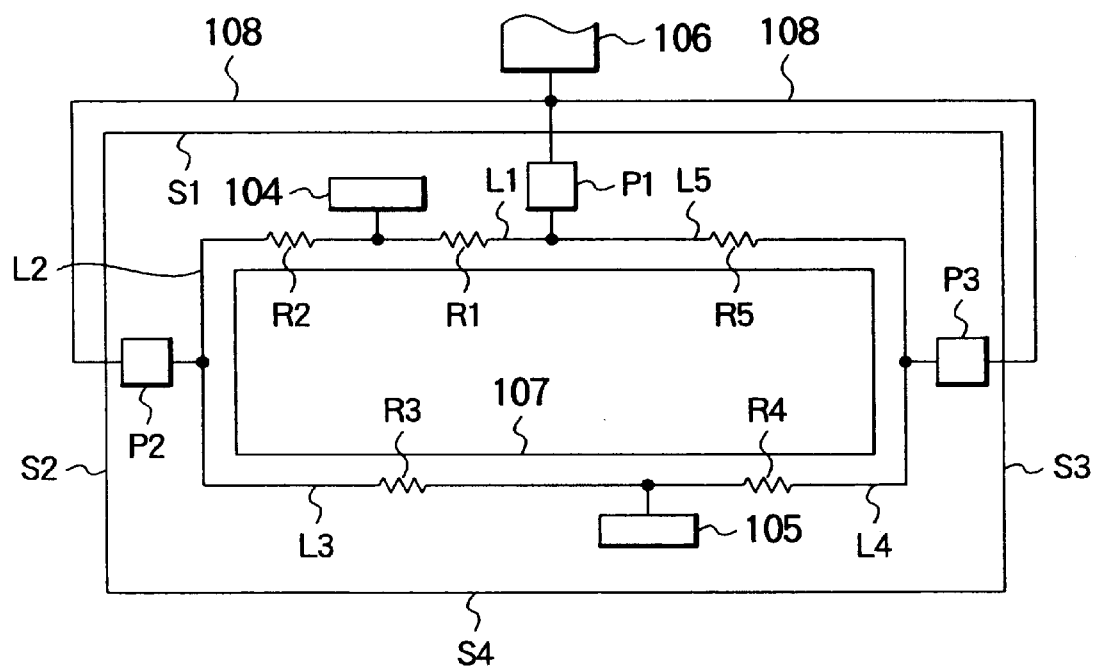
FIG. 2 is a circuit diagram of an improved conventional integrated circuit including a power supply circuit.
Figure 3:
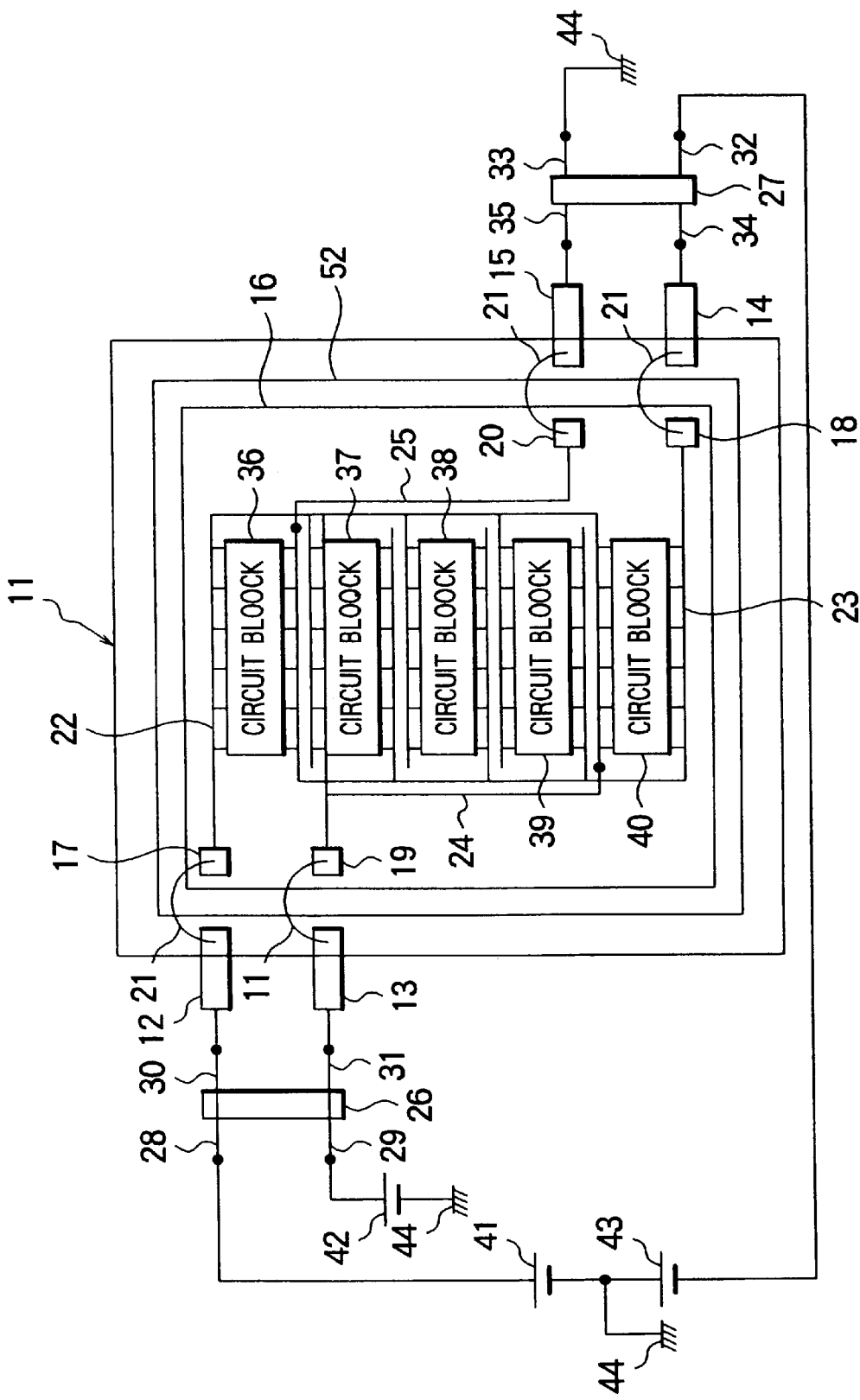
FIG. 3 is a block diagram of a semiconductor integrated circuit including a power supply circuit according to a first embodiment of the present invention.

Referring to FIG. 3, a semiconductor integrated circuit according to a first embodiment of the present invention comprises a lead frame 11 having an island 52 for mounting thereon a pellet 16, and a power supply circuit disposed outside the lead frame 11. The lead frame 11 of the integrated circuit comprises a source terminal 12, a source potential sense terminal 13 for sensing a source potential inside the pellet 16, a ground terminal 14, a ground potential sense terminal 15 for sensing a ground potential inside the pellet 16, and bonding wires 21, all of which are connected to form a part of a power supply circuit. A source pad 17, a ground pad 18, a source potential sense pad 19 for sensing a source potential, and a ground potential sense pad 20 for sensing a ground potential are mounted on the pellet 16.

The source pad 17, ground pad 18, source potential sense pad 19 and ground potential sense pad 20 are connected to the source terminal 12, ground terminal 14, source potential sense terminal 13 and ground potential sense terminal 15, respectively, by bonding wires 21. It is to be noted that each of the bonding wire 21 which connects the source terminal 12 and source pad 17 as well as the bonding wire 21 which connects between the ground terminal 14 and ground pad 18 involves a parasitic resistance caused by a contact resistance or the like.

The pellet 16 mounts thereon a plurality of circuit blocks 36 to 40, which are fed with electric power from a source line 22 connected to the source pad 17 and a ground line 23 connected to the ground pad 18. Each of the source line 22 and ground line 23 is made of a low-impedance metallic film which also involves a parasitic resistance however.

A source potential sense line 24 extends adjacent to a portion of a ground line 23, and is connected between a sense point of the source line 22 and the source potential sense pad 19. The potential of the source line 22 is sensed by the source potential sense line 24, and the sensed potential is delivered to the source potential sense terminal 13 through the pad 19 and the bonding wire 21.

A ground potential sense line 25 extends adjacent to a portion of the source line 22, and is connected between a sense point of the ground line and the ground potential sense pad 20. The potential of the ground line 23 is sensed by the ground potential sense line 25, and the senesced potential is delivered to the ground potential sense terminal 15 through the pad 20 and bonding wire 21.

The sense lines 24 and 25, which are used to sense the supply potential and the ground potential, are each made of a metallic film having a thickness (or width) of one tenth or less the thickness (or width) of the source line 22 and ground line 23 and having a high impedance ten times or more the impedance of the source line 22 and ground line 23 which allows only a small current to flow through the sense lines 24 and 25.

A source potential control circuit for the power supply circuit is disposed outside the lead frame 11, and includes a source potential controller 26, a source potential input line 28, a source potential reference line 29, a source potential output line 30 and a sensed source potential input line 31, each connected to the source potential controller 26, and a reference voltage source 42.

The source potential output line 30 is connected to the source terminal 12 of the lead frame 11, whereas the sensed source potential input line 31 is connected to the source potential sense terminal 13. The source potential input line 28 is connected to a power voltage source 41, whereas the source potential reference line 29 is connected to the reference voltage source 42, which provides a first voltage or operating voltage desired for the operation of the integrated circuit. The power voltage source 41 provides a sum of the first voltage and a second voltage which compensates a voltage drop across the parasitic resistance involved in the source terminal 12, source pad 17, bonding wire 21 and source line 22.

A ground potential control circuit for the power supply circuit is also disposed outside the integrated circuit 11, and includes a ground potential controller 27, a ground potential input line 32, a ground potential reference line 33, a ground potential output line 34 and a sensed ground potential input line 35, which are connected to the ground potential controller 27, and a negative voltage source 43. The ground potential output line 34 is connected to the ground terminal 14, whereas the sensed ground potential input line 35 is connected to the ground potential sense terminal 15. The ground potential input line 32 is connected to the negative voltage source 43, whereas the ground potential reference line 33 is connected to the ground 44. The ground potential reference line 33 represents a system ground of the entire circuit inclusive of the lead frame 11. The negative voltage source 43 provides a sum of the reference ground potential desired for the operation of integrated circuit and a negative voltage which compensates a voltage drop across the parasitic resistance involved in the ground terminal 14, ground pad 18, bonding wire 21 and ground line 23.

Figure 4:
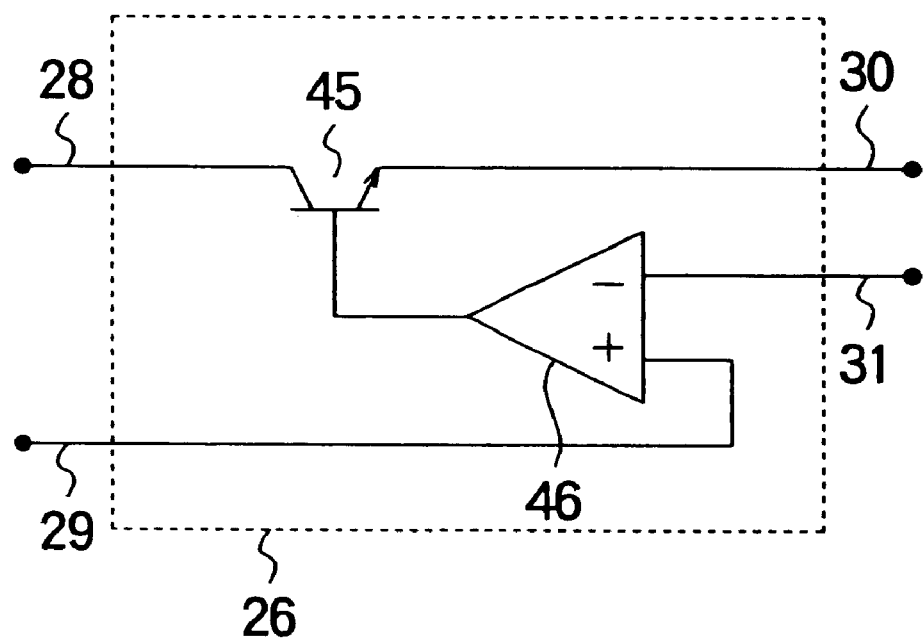
FIG. 4 is a circuit diagram of a source potential controller shown in FIG. 3.

Each of the source potential controller 26 and ground potential controller 27 will be described in detail. It is to be understood that each of these potential controllers 26 and 27 can be implemented by a combination of a transistor and an amplifier, for example. FIG. 4 exemplarily shows the source potential controller 26 in FIG. 3. The ground potential controller 27 is also implemented in a similar manner.

In FIG. 4, the source potential controller 26 comprises a NPN transistor 45 having a collector connected to the source potential input line 28 and an emitter connected to the source potential output line 30, and an amplifier 46 having a non-inverting input (+) connected to the source potential reference line 29, an inverting input (−) connected to the sensed source potential input line 31 and an output connected to the base of the NPN transistor 45.

In response to the difference between the reference source potential and the sensed source potential, the amplifier 46 delivers a potential for controlling the base of the transistor 45 to stabilize the source potential sensed by the source potential sense line 24. Specifically, the transistor 45 delivers an output current to feed the integrated circuit 11 through the source potential output line 30. The output current from the transistor 45 is controlled in accordance with an output potential from the amplifier 46 so that the potential on the source line 22 as sensed by the source potential sense line 24 becomes equal to the reference potential from the reference voltage source 42 shown in FIG. 3.

If the configuration of the source potential controller 26 shown in FIG. 4 is to be used as the ground potential controller 27 shown in FIG. 3, the NPN transistor 45 is replaced by a PNP transistor, and the source potential input line 28, source potential output line 30, source potential reference line 29 and sensed source potential input line 31 are replaced by the ground potential input line 32, ground potential output line 34, ground level reference line 33 and sensed ground potential input line 35, respectively. The operation of the ground potential controller 27 is similar to that of the source potential controller 26.

In operation of the integrated circuit of FIG. 3, it is assumed that there is a large current flowing through the integrated circuit 11 at a low voltage and that the influence of the parasitic resistance in the integrated circuit 11 is significant. The potential of the sense point of the source line 22 is sensed by the source potential sense line 24, delivered to the source potential sense terminal 13, and then input to the sensed source potential input line 31 of the source potential controller 26.

In FIG. 4, it will be understood that the source potential controller 26 is implemented by a voltage follower. The reference source potential is applied to the amplifier 46 from the source potential reference line 29 whereas the sensed source potential is applied thereto from the sensed source potential input line 31. On the basis of the difference between the reference source potential and the sensed source potential thus applied, the amplifier 46 delivers a potential which controls the transistor 45 which in turn delivers a controlled output current to the integrated circuit through the source potential output line 30. The current delivered from the transistor 45 flows through the source terminal 12 to the source line 22 in the integrated circuit.

The output current from the transistor 45 is controlled in accordance with an output potential from the amplifier 46 so that the sensed potential as sensed by the sense line 24 becomes equal to the reference potential from the reference voltage source 42. By feeding the potential on the source potential output line 30 back to the sensed source potential input line 31, the source potential controller 26 maintains the source potential of the source line 22 at a fixed value, which results in the compensation of the voltage drop across the parasitic resistance in the integrated circuit, thereby preventing a malfunction of the circuit blocks 36 to 40.

The ground potential controller 27 operates similarly to the source potential controller 26, and the description of the operation thereof is omitted herein for avoiding a duplication.

In the first embodiment, the source potential controller 26 and ground potential controller 27 maintain a constant source potential and a constant ground potential, respectively, to provide a stable operating voltage for the integrated circuit by eliminating the influence by the parasitic resistance involved in the lead terminals, bonding wires, pads, and wirings of the integrated circuit, thereby effectively preventing a malfunction of the integrated circuit.

In other words, the use of the source potential controller 26 and ground potential controller 27 creates a power supply which compensates a potential fall appearing on the source line and a potential rise appearing on the ground line, both of which are attributable to the parasitic resistance. In this manner, an increase in the current passing through a single source terminal and a single ground terminal is provided for. This allows the number of the source terminals and the ground terminals which are associated with the integrated circuit to be reduced together with the number of the source pads and the ground pads, thereby permitting the size of the integrated circuit to be reduced.

Figure 5:
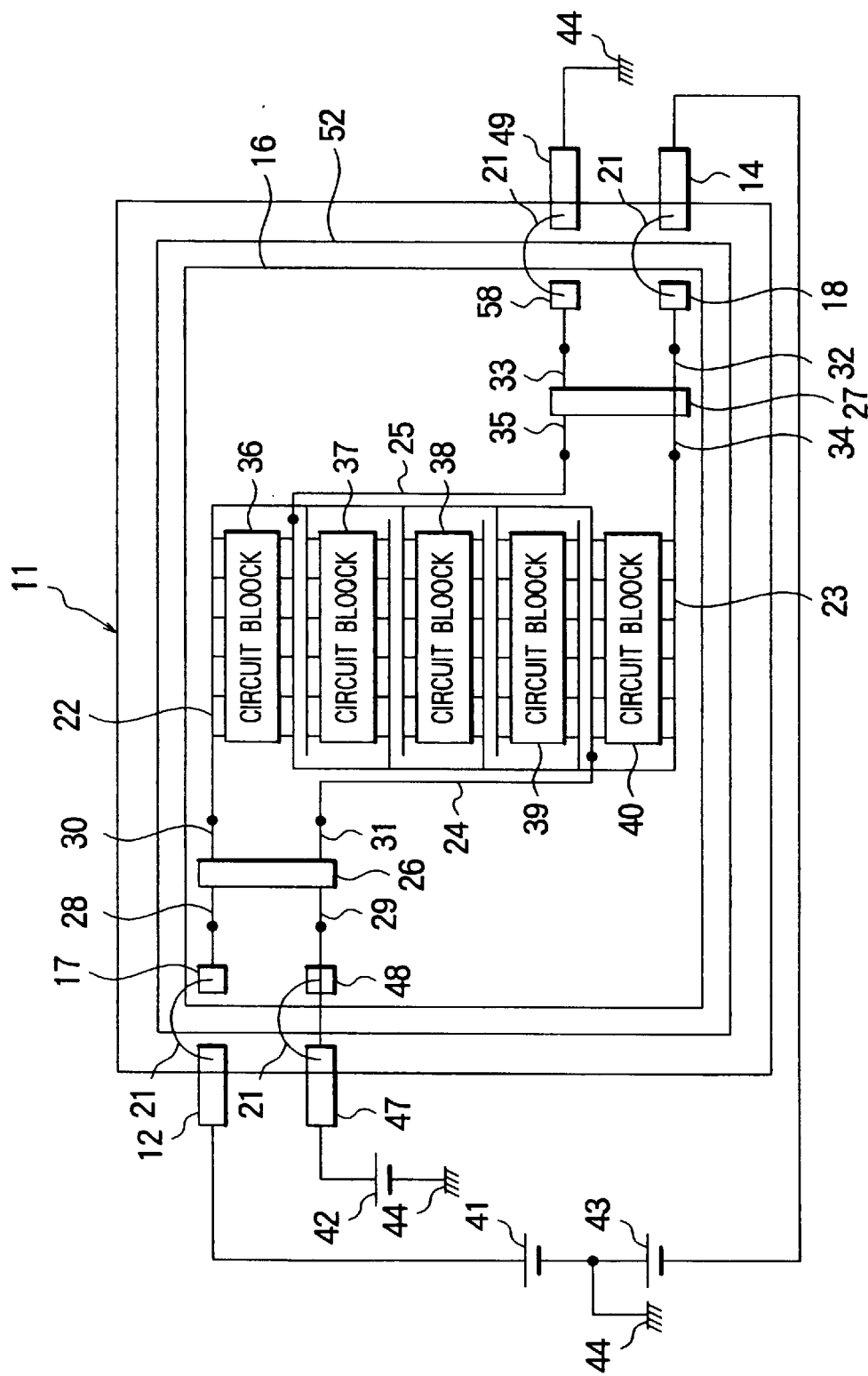
FIG. 5 is a block diagram of a semiconductor integrated circuit including a power supply circuit according to a second embodiment of the present invention.

FIG. 5 shows a semiconductor integrated circuit including a power supply circuit according to a second embodiment of the present invention. The semiconductor integrated circuit of the present embodiment is similar to the first embodiment, except that both the source potential control circuit including the source potential controller 26 and the ground potential control circuit including the ground potential controller 27 are integrated in the pellet 16 of the integrated circuit.

In the second embodiment, since the source potential control circuit and ground potential control circuit are internally housed in the pellet 16 of the integrated circuit, the circuit configuration outside the lead frame 11 of the integrated circuit can be simplified. Accordingly, a stabilized operation of the integrated circuit is assured by merely connecting the lead frame 11 of the integrated circuit with the power voltage source 41, reference voltage source 42, negative voltage source 43, and ground 44. As in the first embodiment, a power supply is obtained which compensates for a fall in the source potential or for a rise in the ground potential, which are caused by the parasitic resistance involved in the source terminal and ground terminal of the semiconductor integrated circuit, thereby maintaining the supply voltage in the integrated circuit at a desired voltage.

To give an example, in a conventional integrated circuit operating with a supply voltage of 3 volts and having a current flow of 10 A, if the parasitic resistance involved with the source terminal, source pad and the bonding wire is equal to $0.1\Omega$ and if the parasitic resistance involved with the ground terminal, ground pad, bonding wire and ground linw is equal to $0.1\Omega$, there results a voltage drop of 2 volts due to the parasitic resistance in the supply voltage of the integrated circuit, whereby the effective supply voltage within the integrated circuit will be 1 volt, thereby causing a malfunction. However, with the semiconductor integrated circuit according to the present invention, the occurrence of the malfunction of the semiconductor integrated circuit as a consequence of the voltage drop attributable to the parasitic resistance can be avoided.

Also, in accordance with the present invention, the use of the source potential control circuit and ground potential control circuit creates a supply voltage which compensates for the voltage drop caused by the parasitic resistance without relying on a value of current flow through the supply terminal and the ground terminal, providing an advantage that the current which can be passed through a single supply terminal and ground terminal can be increased. Since the current flowing through the single source terminal and ground terminal can be increased, the number of source terminals and ground terminals used in the semiconductor integrated circuit can be reduced together with the number of source pads, thereby enabling a reduction in the size of the integrated circuit.

Since the above embodiments are described only as examples, the present invention is not limited to the above embodiments, and various modifications or alterations can be easily made therefrom by those skilled in the art without departing from the scope of the present invention.

What is claimed is:

1. A semiconductor integrated circuit comprising a lead frame and a pellet mounted on said lead frame, said pellet including a source line having a first impedance per unit length, a ground line having a second impedance per unit length, an internal circuit connected to said source line and said ground line for receiving electric power from said source line and said ground line, a source potential sense line connected to a first sense point of said source line and having a third impedance per unit length different from said first impedance per unit length, and a ground potential sense line connected to a second sense point of said ground line and having a fourth impedance per unit length different from said second impedance per unit length.

2. A semiconductor integrated circuit as claimed in claim 1, further comprising:

first through fourth pads connected to said source line, said ground line, said source potential sense line, and said ground potential sense line, respectively, and first through fourth terminals connected to said first through fourth pads, respectively, by bonding wires.

3. A semiconductor integrated circuit as claimed in claim 1, further comprising a source potential control circuit for controlling a potential of said source line based on a first potential supplied from said source potential sense line and a first reference potential, and a ground potential control circuit for controlling a potential of said ground line based on a second potential supplied from said ground potential sense line and a second reference-potential.

4. A semiconductor integrated circuit as claimed in claim 2, wherein said third impedance per unit length is higher than said first impedance per unit length, and wherein said fourth impedance per unit length is higher than said second impedance per unit length.

5. A semiconductor integrated circuit as claimed in claim 4, wherein said third impedance per unit length is not lower than ten times said first impedance per unit length, and wherein said fourth impedance is not lower than ten times said second impedance per unit length.

6. A semiconductor integrated circuit as claimed in claim 3, wherein said source potential control circuit and said ground potential control circuit are disposed outside said lead frame.

7. A semiconductor integrated circuit as claimed in claim 3, wherein said source potential control circuit and said ground potential control circuit are disposed inside said pellet.

8. A semiconductor integrated circuit as claimed in claim 3, wherein said third impedance per unit length is higher than said first impedance per unit length, and wherein said fourth impedance per unit length is higher than said second impedance per unit length.

9. A semiconductor integrated circuit as claimed in claim 6, wherein said source line and said source potential sense line are connected to said source potential control circuit through respective pads formed on said pellet, and wherein said ground line and said ground potential sense line are connected to said ground potential control circuit through respective pads formed on said pellet.

10. A semiconductor integrated circuit as claimed in claim 8, wherein said third impedance per unit length is not lower than ten times said first impedance per unit length, and wherein said fourth impedance per unit length is not lower than ten times said second impedance per unit length.

11. An electric power supply circuit for supplying electric power to a semiconductor integrated circuit said semiconductor integrated circuit having a lead frame and a pellet mounted on said lead frame, said pellet including a source line having a first impedance per unit length, a ground line having a second impedance per unit length, an internal circuit connected to said source line and said ground line for receiving electric power therefrom, a source potential sense line connected to a first sense point of said source line and having a third impedance per unit length different from said first impedance per unit length, and a ground potential sense line connected to a second sense point of said ground line and having a fourth impedance per unit length different from said second impedance per unit length, said electric power supply circuit comprising a source potential controller connected to said source line and said source potential sense line, a ground potential controller connected to said ground line and said ground potential sense line, a power voltage source for supplying a source potential to said source potential controller, a reference voltage source for supplying a reference source potential, a reference ground potential input line for supplying a reference ground potential to said ground potential controller, and a negative voltage source for supplying a negative potential to said ground potential controller, wherein said source potential controller controls said source line at a first constant potential based on said reference source potential, and wherein said ground potential controller controls said ground line at a second constant potential based on said reference ground potential.

12. An electric power supply circuit as claimed in claim 11, wherein said source potential controller and said ground potential controller are disposed outside said lead frame.

13. An electric power supply circuit as claimed in claim 11, wherein said source potential controller and said ground potential controller are disposed inside said pellet.

14. An electric power supply circuit as claimed in claim 11, wherein said third impedance per unit length is higher than said first impedance per unit length, and wherein said fourth impedance per unit length is higher than said second impedance per unit length.

15. An electric power supply circuit as claimed in claim 14, wherein said third impedance per unit length is not lower than ten times said first impedance per unit length, and wherein said fourth impedance per unit length is not lower than ten times said second impedance per unit length.

* * * * *